US010524369B2

(12) United States Patent
Chiu et al.

(10) Patent No.: US 10,524,369 B2
(45) Date of Patent: Dec. 31, 2019

(54) INFORMATION HANDLING SYSTEM UNIVERSAL MONITOR MOUNT

(71) Applicant: Dell Products L.P., Round Rock, TX (US)

(72) Inventors: Cheng-Chia Chiu, New Taipei (TW); Antonio T. Latto, Austin, TX (US); Chung-An Lin, Taipei (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/900,992

(22) Filed: Feb. 21, 2018

(65) Prior Publication Data
US 2019/0261525 A1    Aug. 22, 2019

(51) Int. Cl.
H05K 5/00    (2006.01)
H05K 5/02    (2006.01)
F16M 11/04   (2006.01)
F16M 13/02   (2006.01)
G09G 5/00    (2006.01)
G06F 1/18    (2006.01)
G06F 1/16    (2006.01)

(52) U.S. Cl.
CPC ......... H05K 5/0234 (2013.01); F16M 11/046 (2013.01); F16M 13/02 (2013.01); G06F 1/1601 (2013.01); G06F 1/182 (2013.01); G09G 5/006 (2013.01); G06F 2200/1612 (2013.01)

(58) Field of Classification Search
None
See application file for complete search history.

(56) References Cited

U.S. PATENT DOCUMENTS

| 3,905,484 | A  | * | 9/1975  | Dean ..................... A47B 57/58 211/184 |
| 5,816,673 | A  | * | 10/1998 | Sauer ..................... G06F 1/184 312/223.2 |
| 8,477,496 | B2 | * | 7/2013  | Zhang ..................... G06F 1/187 165/122 |
| 9,301,419 | B1 | * | 3/2016  | Tsai ..................... H05K 7/1438 |
| 2010/0188812 | A1 | * | 7/2010 | Morrison ............. F16M 11/041 361/679.58 |
| 2013/0222996 | A1 | * | 8/2013 | Stokman ............... G06F 1/1607 361/679.22 |

FOREIGN PATENT DOCUMENTS

WO    WO2005089046    9/2005

OTHER PUBLICATIONS

Dell, "Dell OptiPlex Micro All-in-One Mount for Monitors," downloaded from https://www.dell.com/en-us/shop/accessories/apd/452-bczu, Oct. 26, 2018, 5 pages.

* cited by examiner

Primary Examiner — Courtney L Smith
Assistant Examiner — Rashen E Morrison
(74) Attorney, Agent, or Firm — Zagorin Cave LLP; Robert W. Holland

(57) ABSTRACT

A display stand information handling system adapter holds an information handling system in place at the rear of a display stand by configuring adapter members to securely couple to the display stand. Plural top supports each engage predetermined display stand top surfaces so that the adapter configures for a predetermined display stand by coupling the associated top support. Sliding wings adapt to the display stand width and couple with an attachment clip that captures the display stand in the adapter.

9 Claims, 8 Drawing Sheets

INFORMATION HANDLING SYSTEM UNIVERSAL MONITOR MOUNT

BACKGROUND OF THE INVENTION

Field of the Invention

The present invention relates in general to the field of information handling systems, and more particularly to an information handling system universal monitor mount.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems process information with processing components disposed in a housing. Information handling systems are manufactured with a variety of portable and stationary housing configurations. Conventional "desktop" information handling systems generally couple to fixed connectors in a stationary location, such as an office cubicle. Desktop information handling systems generally have an external power cable that connects to an AC wall socket and an Ethernet cable that connects to a networking socket. Typically, desktop information handling systems include ports that couple to peripheral devices, such as a keyboard, a mouse, a display, a printer, etc. In a conventional desktop environment, the information handling system is connected to power, networking and peripheral cables and then placed in as unobtrusive of a location as possible, such as in a cabinet or at the rear of the desktop surface.

Generally, information handling systems that have large housings can include more powerful processing components that process information more rapidly. Larger housings offer more room to support larger power supplies, cooling fans and storage devices. Recently, however, trends in the development of portable information handling systems have resulted in more efficient information handling systems that use less power and generate less heat during operations. As a result, desktop information handling systems have trended towards smaller housing sizes that fit on a desktop using less space.

Often, the information handling system display is the largest device on a desktop work space. For example, typical desktop displays have twenty-four inch or greater screen sizes and are held erect by sturdy display stands that rest on the desktop. A typical display stand includes adjustable members that raise, lower, tilt and rotate the display. Typical display stands include a standardized display coupling mechanism that allows the stand to couple with displays of varying sizes and from different manufacturers. For example, VESA defines a Flat Panel Mounting Interface Standard (FDMI) and Mounting Interface Standard (MIS) that states dimensions of four-hole attachment points on the back of a display, the pattern of the attachment points and screws that fit into the holes. In many cases, an end user who replaces a display can keep the same stand by coupling the replacement display to the existing display stand.

With the introduction of desktop information handling systems that have smaller housings, a convenient option to get the information handling system out of the way of the end user is to mount the information handling system on the display stand at the rear of the display. For example, a mounting bracket is disposed on the back of the display stand that has VESA standard screw locations. The information handling system has openings aligned to couple to the mounting bracket so that the information handling system mounts in a raised position on the back of the display stand out of sight and conveniently placed to couple with external cables.

One difficulty with mounting information handling systems on display stands is that display stands tend to have a variety of sizes, shapes and structural designs that change over production cycles. End users tend to reuse standards based display stands across multiple displays and years. Thus, the integration of an information handling system mount on a display stand presents a challenge since the information handling system mount generally lacks a standardized form.

SUMMARY OF THE INVENTION

Therefore, a need has arisen for a system and method which provides an information handling system universal monitor mount.

In accordance with the present invention, a system and method are provided which substantially reduce the disadvantages and problems associated with previous methods and systems for mounting an information handling system to a display stand. An adapter couples to a display stand vertical support arm to couple with an information handling system and hold the information handling system in a raised position at the rear of the display. The adapter accepts a removable top support that fits display stand top surfaces of different shapes.

More specifically, an information handling system processes information with processing components disposed in a housing and presents the information as visual images at a display disposed on a display stand. The display stand includes a vertical support arm that holds the display in an elevated viewing position, such as at a desktop. An adapter couples to the vertical support arm to expose a coupling plate at the rear of the display to which an information handling system couples, such as in a raised position at the rear of the display and out of view of an end user viewing the display. The adapter has plural removable top supports that selectively insert to engage a display support stand vertical support top surface so that the adapter rests snuggly against the vertical support top surface. The adapter has plural attachment clips of different lengths and shapes that engage around a display vertical support surface to hold the adapter against the vertical support, such as by screwing at each end into the adapter. Opposing wings of the adapter slide laterally relative to a main central portion to adjust the adapter width to the width of the display stand vertical support. An end user selects a removable top support and attachment clip that fit onto the display vertical support of interest so that the adapter scales across multiple display stand configurations.

The present invention provides a number of important technical advantages. One example of an important technical advantage is that a universal information handling system mount couples to a variety of display stand structures to adapt to display stands already distributed to end users. Moveable members adapt the mount to engage against the display stand structure in a secure manner independent of the display stand design and lock in place to provide a firm mounting surface. Attachable pieces that fit on the mount adapt the moveable members to specific display stand formats, such as those in use by display stands distributed to end users. Common information handling system mounting points are leveraged to create a simple kit based system that supports information handling system mounting to an array of display stands, with attachable pieces increasing the adaptability of system across a greater range of display stand designs.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A universal information handling system display stand mount adapts display stands to support an information handling system coupled at the rear of a display. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
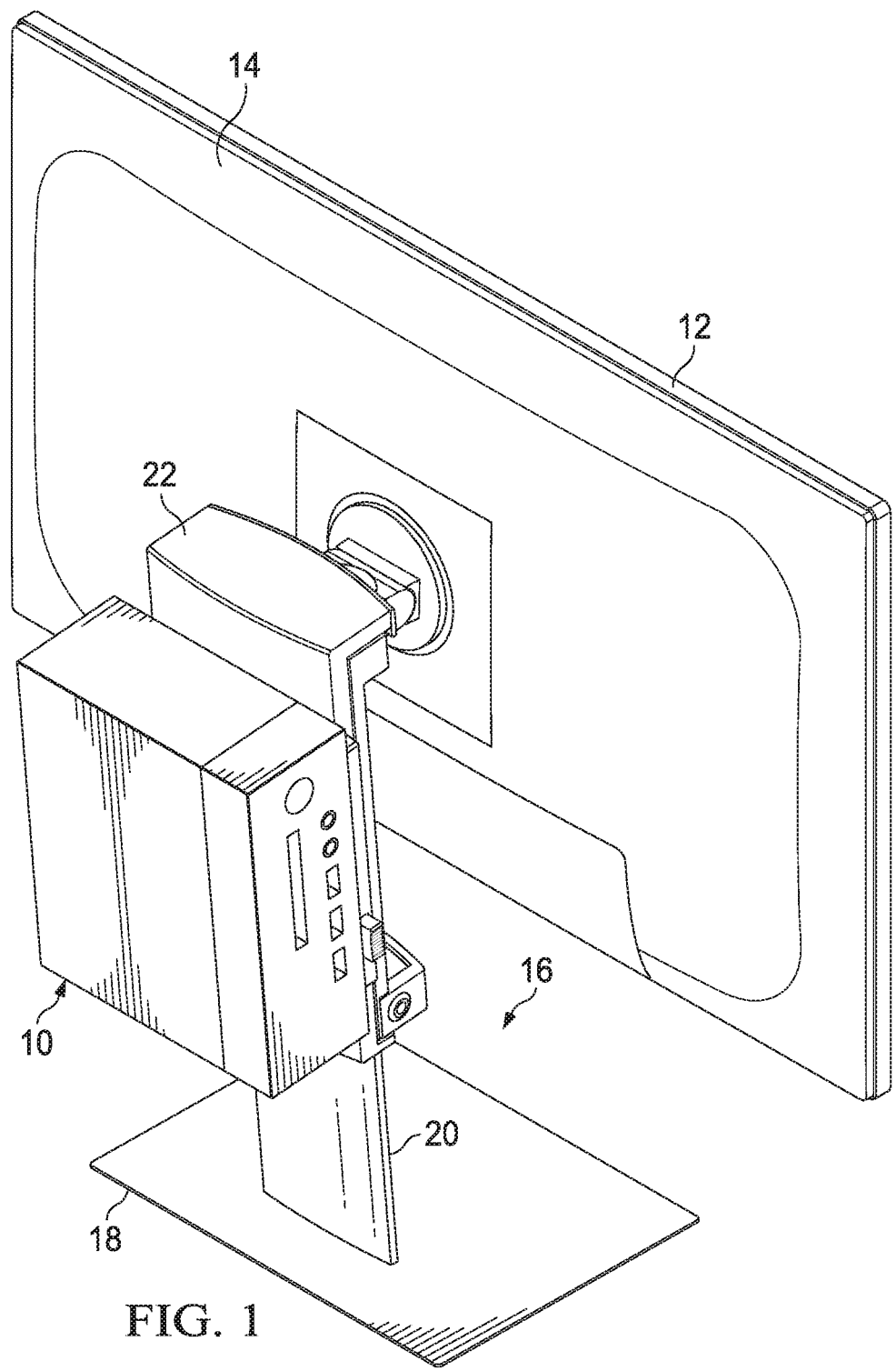
FIG. 1 depicts an information handling system coupled to the rear of a display in a raised position held by an adapter coupled to the display's stand.

Referring now to FIG. 1, an information handling system 10 couples to the rear of a display 12 in a raised position held by an adapter 22 coupled to the display's stand 16. Information handling system 10 is in a raised position at display rear surface 14 so that it is held out of view of an end user viewing display 12. In the example embodiment, display stand 16 has a base 18 that rests on a desktop surface and a vertical support arm 20 that holds display 12 in a raised position. In one example embodiment, vertical support 20 extends and retracts so that an end user may vary the height of display 12. An adapter 22 couples to vertical support 20 to adapt display stand 16 to hold information handling system 10 in the raised position.

Figure 2:
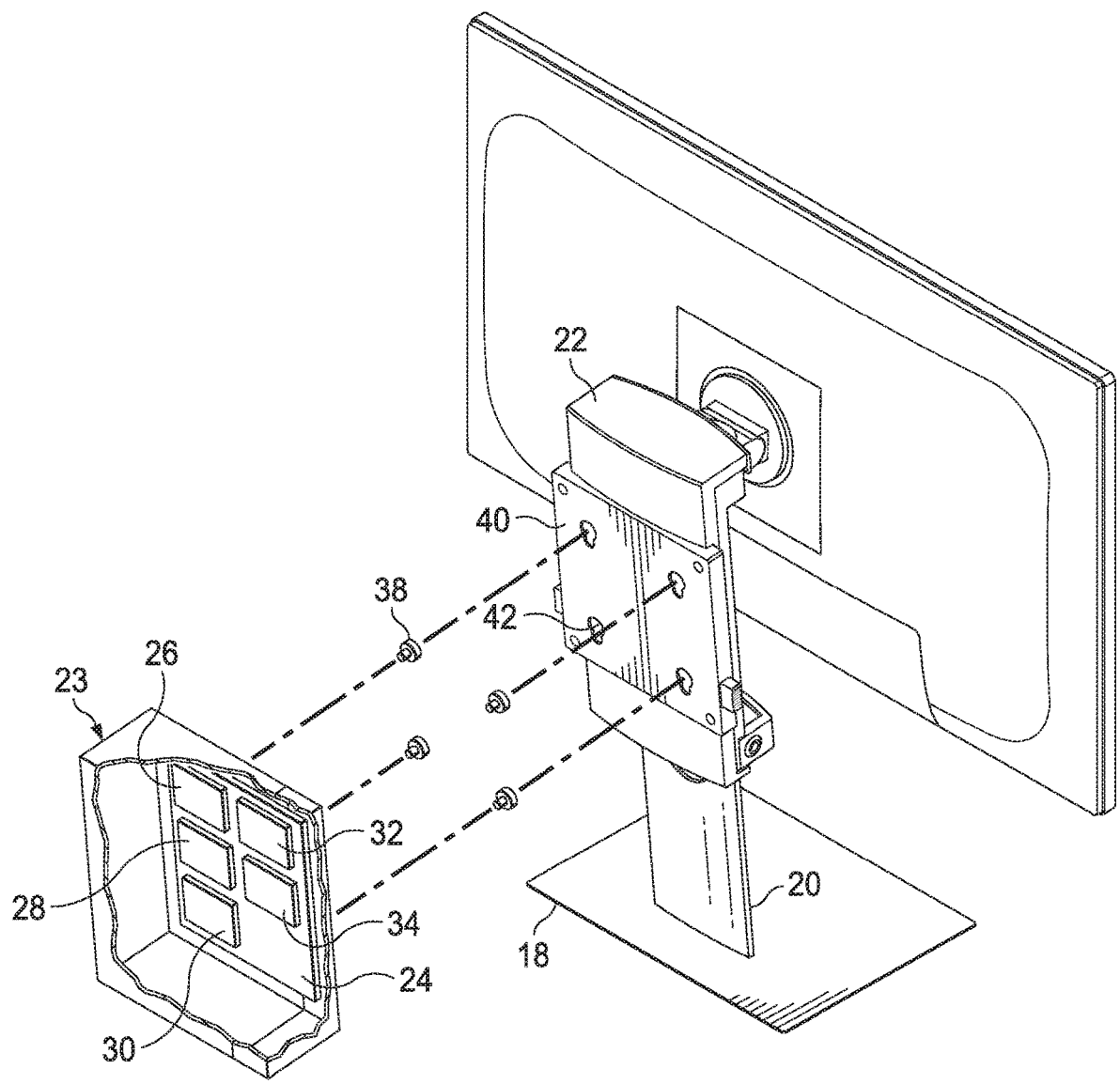
FIG. 2 depicts an exploded view of an information handling system with a housing base aligned to couple to an information handling system coupling plate of the adapter.

Referring now to FIG. 2, an exploded view of information handling system 10 is depicted with a housing base 36 aligned to couple to an information handling system coupling plate 40 of adapter 22. Information handling system 10 has plural processing components disposed in a housing 23 that cooperate to process information. In the example embodiment, a motherboard 24 provides an interface between a central processing unit (CPU) 26 and random access memory 28 (RAM) to communicate information. For instance, CPU 26 executes instructions stored in RAM 28 to process visual information that defines visual images for presentation at display 12. A graphics processor unit (GPU) 30 processes the visual information to generate pixel values for presentation at display 12. In the example embodiment, a solid state drive (SSD) 30 provides persistent storage from which an operating system and applications are retrieved to execute on CPU 26. A chipset 34 includes processors and embedded code stored in flash memory that coordinate interactions between the processing components, such as to support interactions with input/output (I/O) devices like a keyboard, mouse and touchscreen. The example embodiment depicts an example information handling system configuration that supports presentation of information at display 12 and interactions through I/O devices disposed proximate display 12. Alternative embodiments may have alternative configurations that provide networking and other functions.

In the example embodiment, the backside of housing 23 has screw lugs 38 that extend outward aligned to insert into screw lug slots 42 formed in information handling system coupling plate 40. In the example embodiment, slots 42 have a narrow bottom portion so that screw lugs 38 are captured as the weight of information handling system 10 presses screw lugs 38 downward towards base 18. As is described and depicted below, in the example embodiment screw lugs 38 and slots 42 have a square configuration that matches the configuration used by display 12 to couple to display stand 16. In alternative embodiments, other types of coupling arrangements may be used to attach information handling system 10 to adapter 22, such as directly screwing screws into threaded slots or reversing the screws to extend from coupling plate 40 and fit into slots formed in information handling system 10.

Figure 3:
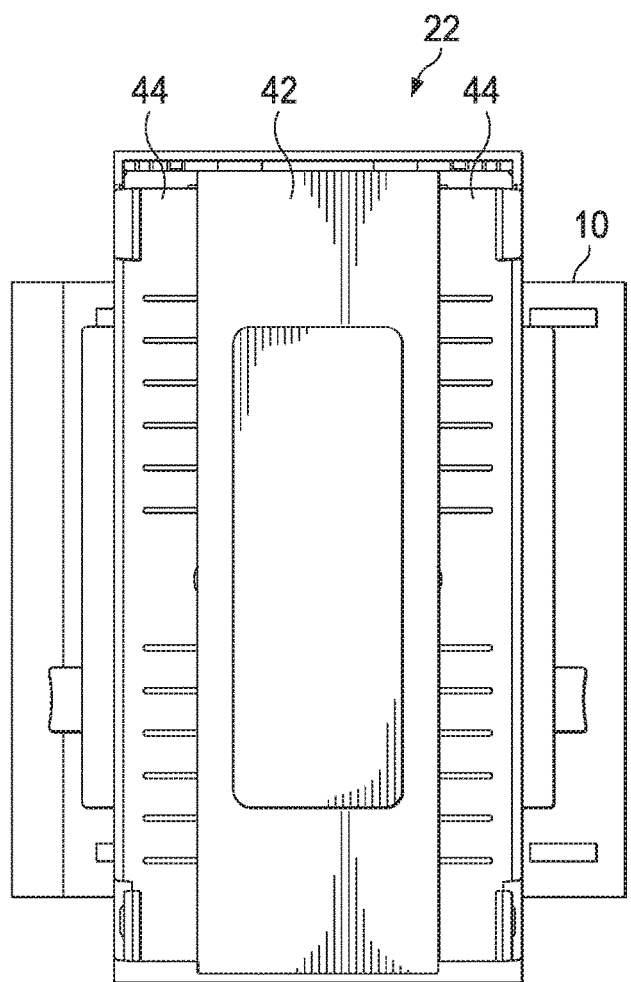
FIG. 3 depicts a front view of an adapter removed from the display stand and having an information handling system coupled to its coupling plate.

Referring now to FIG. 3, a front view depicts adapter 22 removed from the display stand and having an information handling system 10 coupled to its coupling plate. Adapter 22 has a base plate 42 that aligns with a display stand vertical support. A friction pad 46 couples to base plate 42 to generate friction against a display stand vertical support so that adapter 22 is less likely to move relative to a display stand to which it couples. On each side of base plate 42, opposing wings 44 slide laterally to adjust the width of adapter 22 where adapter 22 couples to an information handling system display stand. A top surface 48 extends outward perpendicular from base plate 42 to form a resting surface that rests on the top of a display stand to which adapter 22 couples. In the example embodiment, opposing wings 44 slide to opposite and equal positions to center friction pad 46 on the display stand, and have securing members that extend outward to aid in alignment and securing of adapter 22 to the display stand.

Figure 4:
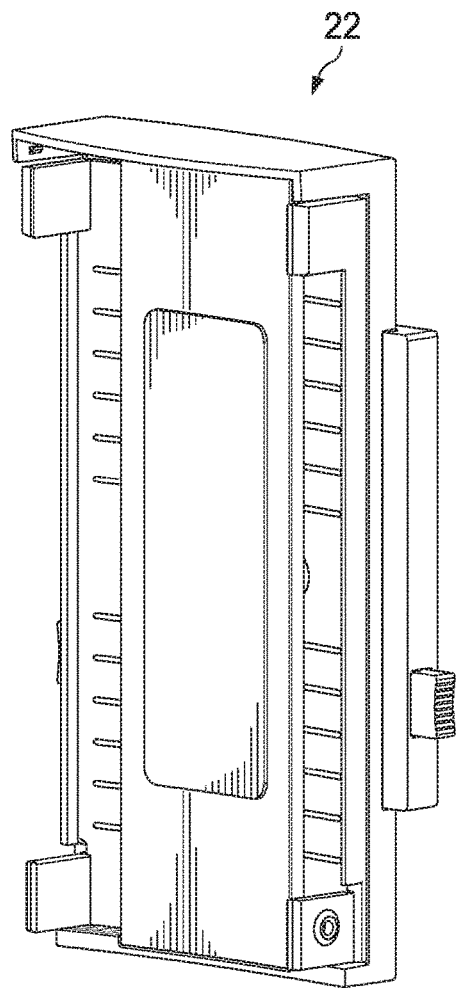
FIG. 4 depicts a side perspective view of an adapter opposing wings extended to adapt to a display stand vertical support arm having a 100 mm width.

Referring now to FIG. 4, a side perspective view of adapter 22 depicts opposing wings 44 extended to adapt to a display stand vertical support arm having a 100 mm width. In the example embodiment, coupling plate 40 is exposed at a rear side of adapter 22 to couple to an information handling system. In various embodiments, coupling plate 40 may be replaceable to allow different types of information handling system coupling arrangements.

Figure 5:
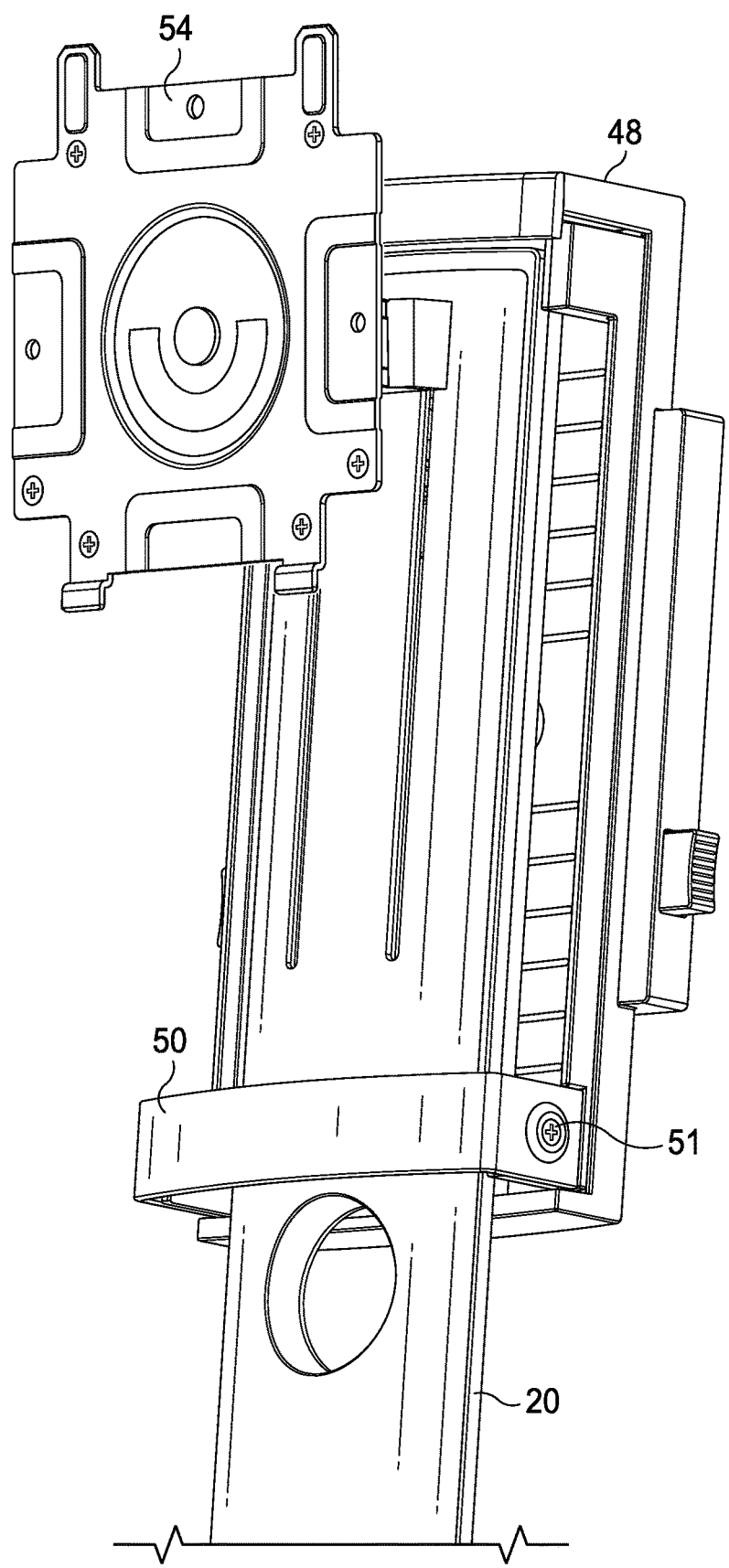
FIG. 5 depicts a side perspective view of an adapter coupled to an example display stand vertical support arm.

Referring now to FIG. 5, a side perspective view depicts adapter 22 coupled to an example display stand vertical support arm 20. A display support plate 54 extends outward from vertical support 20 to couple with a display, such as with the VESA standard display attachment. For instance, display support plate 54 accepts screws in a rectangular configuration similar to that of information handling system coupling plate 40, as described and depicted above. Adapter 22 top surface 48 rests on top of display stand vertical support 20 to secure adapter 22 at a fixed location relative to vertical support 20. An attachment clip 50 wraps around vertical support 20 to hold adapter 22 securely against display support stand vertical support 20. In the example embodiment, a screw 51 couples each end of attachment clip 50 to each of opposing wings 44. As is set forth below in greater detail, sliding of wings 44 and selection of an attachment clip 50 of an appropriate length allows adapter 22 to snuggly fit around display stand vertical stands of varying width. In addition, top surface 48 accepts a replaceable insert that adapts different shapes of display stand upper surfaces. In the example embodiment, the native top surface 48 of adapter 22 forms a lip that fits over a flat display stand top surface and also forms a cavity into which replaceable top supports couple.

Figure 6A:
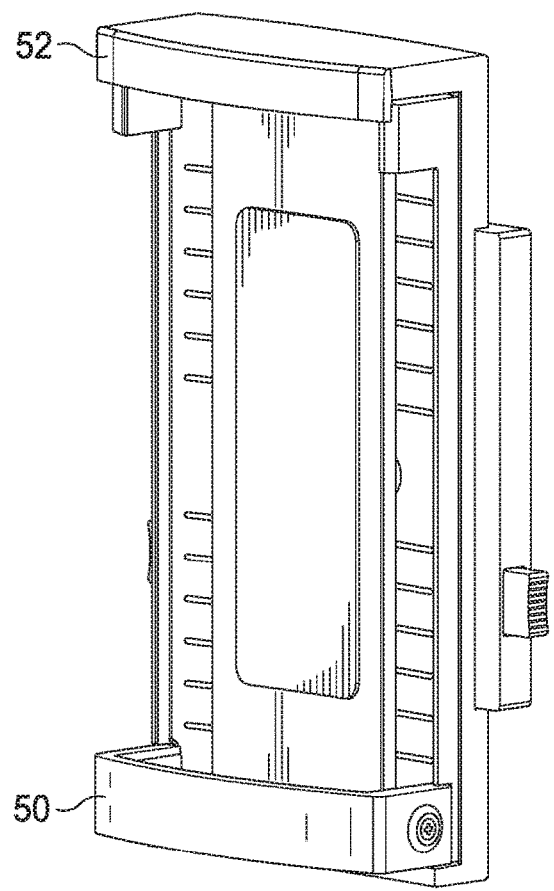
FIGS. 6A-6E depict example configurations of an adapter that accepts display stands of different shapes.
Figure 6B:
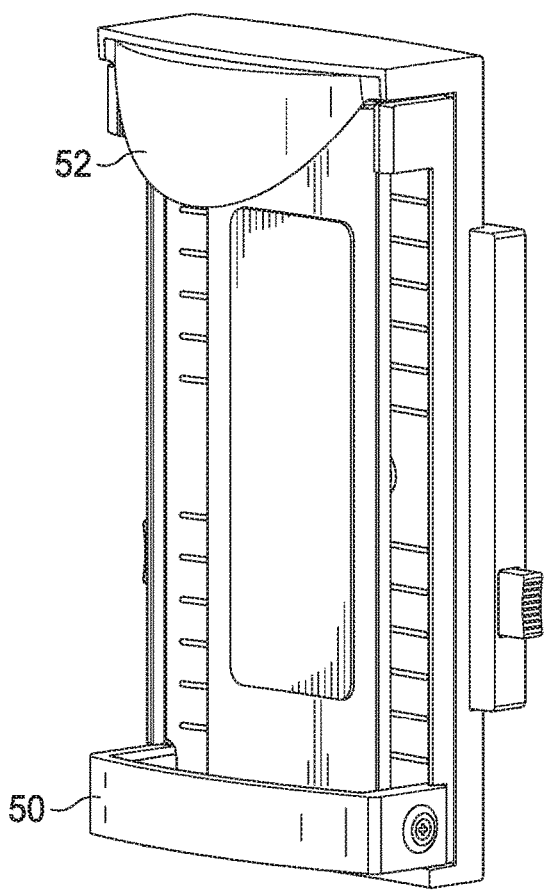
Figure 6C:
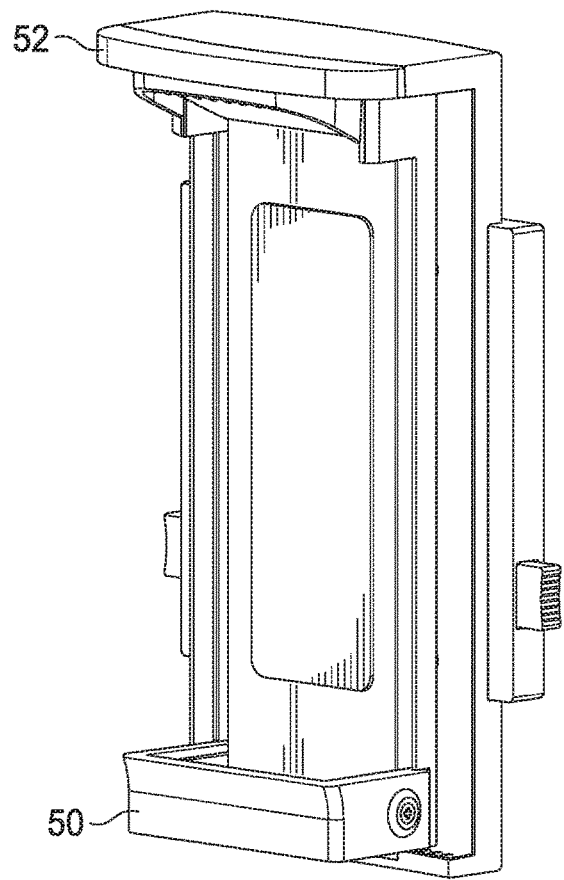
Figure 6D:
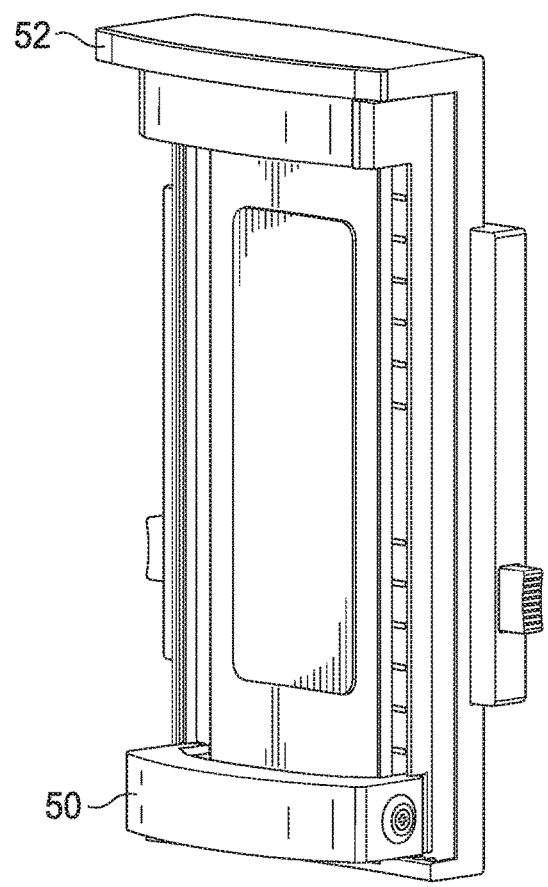
Figure 6E:
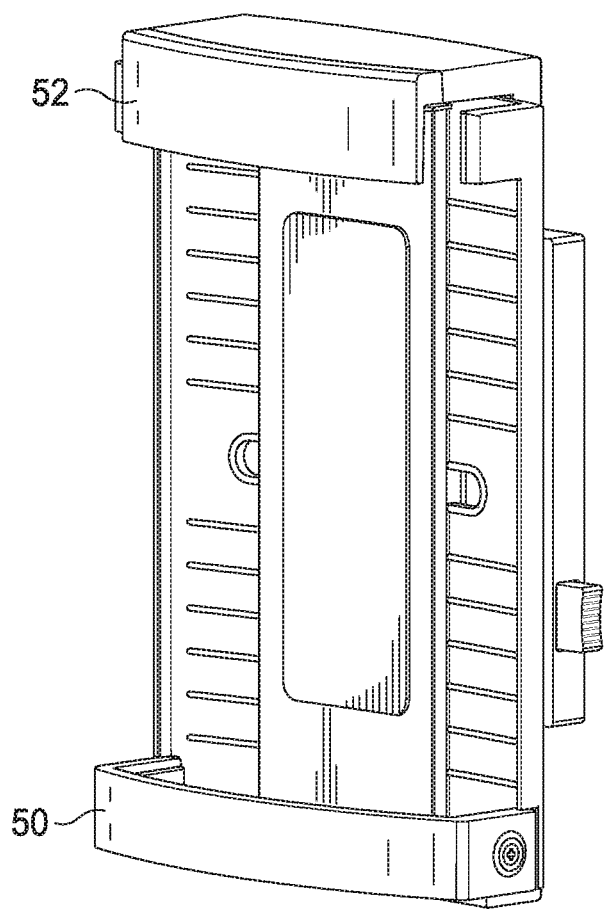

Referring now to FIGS. 6A-6E, example configurations of adapter 22 are depicted that accept display stands of different shapes. FIG. 6A depicts adapter 22 configured to couple to a 100 mm display stand vertical support having a flat upper surface. FIG. 6B depicts adapter 22 having a rounded attachment clip 50 and an angled removable top support 52 that allows adapter 22 to couple to a 100 mm display stand that has a curved front surface and angled top surface. FIG. 6C depicts adapter 22 having opposing wings 44 slid laterally inward to fit snuggly to a 69 mm display stand vertical support with a shorter and more rectangular attachment clip 50 and curved and open removable top support 52 that rests on top of a curved display stand upper surface. FIG. 6D depicts adapter 22 having opposing wings 44 slid inward to fit an 80 mm wide display stand vertical support with a curved attachment clip 50. FIG. 6E depicts opposing wings 44 slid laterally outward to a 130 mm width that couples to a wider display stand vertical support and a slightly rounded attachment clip 50. The various example embodiments illustrate how adapter 22 adjusts on a stand-by-stand basis to support deployed display stands. An end user adjusts adapter 22 by inserting a removable top support 52 that matches the upper surface of the display stand vertical support and coupling an attachment clip around the vertical support to hold adapter 22 snuggly in place. Removable top support 52 and attachment clip 50 may couple to adapter 22 with screws, clips, snaps or other desired coupling devices.

Figure 7:
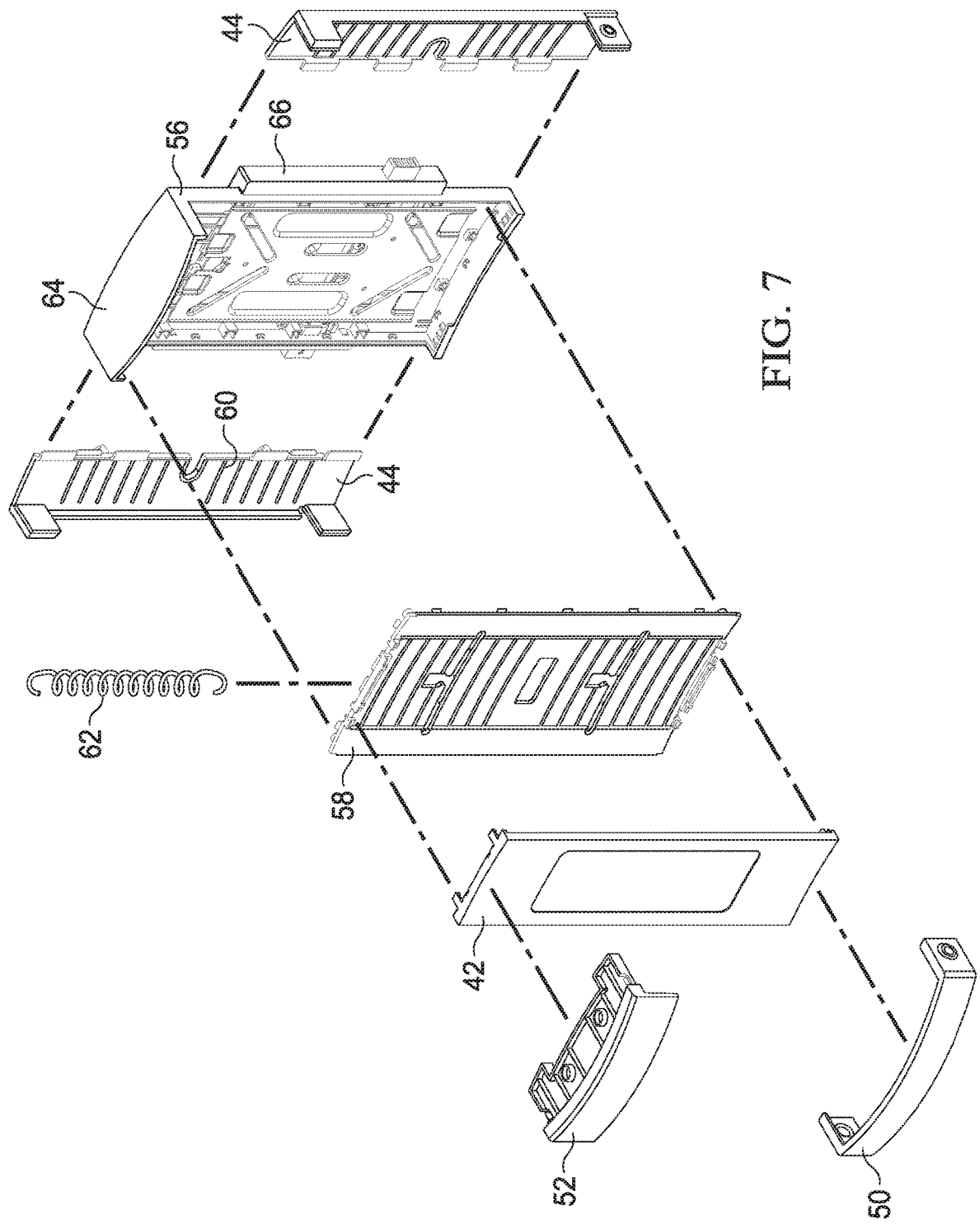
FIG. 7 depicts an exploded view of adapter components that are assembled to build the display stand adapter.

Referring now to FIG. 7, an exploded view depicts adapter 22 components that are assembled to build adapter 22. Base plate 42 couples to a back guide plate 58 to provide a central support surface that securely rests against a display vertical support. Opposing wings 44 couple at the back of guide plate 58 to align guides 60 that guide lateral sliding movement of opposing wings 44. In one example embodiment, a biasing mechanism 62, such as a spring, biases opposing wings 44 towards each other. Back guide plate 58 fits over opposing wings 44 to assemble into a main body 56 with stops 66 on opposing wings 44 preventing removal of the opposing wings from the assembly. A lid portion 64 extends over main body 56 to provide sufficient support to carry the weight of an information handling system coupled to coupling plate 40 at the back side of main body 56. That is, the weight of an information handling system coupled to adapter 22 forces lid portion 64 downward against the upper surface of the vertical support. In one example embodiment, lid portion 64 is formed to adapt to a predetermined display stand vertical support shape, such as a flat top surface. A removable top support 52 inserts into lid portion 64 to adapt lid portion 64 to the shape of a desired display stand top surface. As is set forth above in greater detail, a user selects from plural available removable top supports 52 and plural available attachment clips 50 to match a display stand so that adapter 22 couples securely to the display stand.

Although the present invention has been described in detail, it should be understood that various changes, substitutions and alterations can be made hereto without departing from the spirit and scope of the invention as defined by the appended claims.

What is claimed is:
1. An information handling system comprising:
   a housing;
   processing components disposed in the housing and cooperating to process information, the processing components including at least a graphics controller operable to generate visual information that defines a visual image;
   a display stand having a vertical support extending from a base to a top surface and a display support plate exposed on a front side;
   a display coupled to the display stand and interfaced with the graphics controller to present the visual information as the visual image;
   an adapter coupled to the display stand rear side to expose an information handling system coupler, the adapter having a base plate that rests against the display stand vertical support rear side, opposing wings that slide relative to the base plate to adjust to a width of the vertical support, a removable top support configured to engage the display stand top surface and an attachment clip that couples over the vertical support front side to each of the opposing wings;
   plural replaceable top supports, each top support configured to engage a different display stand top surface shape;

plural attachment clips, each attachment clip having a different length to couple across display stand vertical support front sides of different widths; and first and second screws that couple the attachment clip to the first and second wings;

wherein the housing removeably couples to the information handling system coupler.

2. The information handling system of claim 1 further comprising:

four extensions protruding from the housing;

wherein the four extensions align with and insert into openings of the adapter information handling system coupler to couple the information handling system to the stand.

3. The information handling system of claim 2 wherein four extensions match a location of coupling points for the display stand support plate.

4. The information handling system of claim 1 wherein the opposing wings comprise first and second pieces having guides formed that engage guides formed in the base plate to slide between a narrow and a wide configuration.

5. The information handling system of claim 4 further comprising a friction pad disposed between the base plate and the display stand vertical support.

6. The information handling system of claim 1 further comprising a biasing mechanism coupled to the opposing wings biasing the opposing wings towards each other.

7. An information handling system display stand adapter comprising:

a main body;

a coupling plate disposed at a first side of the main body and configured to couple to an information handling system;

plural top supports, each top support having a different shape, each different shape configured to engage with a predetermined display stand selected from plural display stands, each top support selectively coupling to the main body to configure the adapter to engage with the predetermined display stand associated with the top support by coupling the top support over a most upper surface of the predetermined display stand;

opposing wings coupled to the main body and sliding relative to each other to adapt to plural display stand widths;

an attachment clip that couples to each opposing wing to capture the display stand; and a first screw that couples a first attachment clip end to a first opposing wing and a second screw that couples a second attachment clip end to a second opposing wing.

8. The information handling system display stand adapter of claim 7 further comprising a lid portion of the main body adapted to couple with each top support.

9. The information handling system display stand adapter of claim 7 further comprising a friction pad coupled to the main body and aligned to work against the display stand.

* * * * *